United States Patent
Weller et al.

(10) Patent No.: US 6,753,677 B1
(45) Date of Patent: Jun. 22, 2004

(54) TRIGGER JITTER REDUCTION FOR AN INTERNALLY TRIGGERED REAL TIME DIGITAL OSCILLOSCOPE

(75) Inventors: Dennis J Weller, Colorado Springs, CO (US); Steven D Draving, Colorado Springs, CO (US); Ralph Urban, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/376,748

(22) Filed: Feb. 28, 2003

(51) Int. Cl.[7] .................. G01R 13/20; G01R 23/16; G06F 19/00

(52) U.S. Cl. ............... 324/121 R; 324/76.22; 702/69

(58) Field of Search ............... 324/121 R, 76.11–76.15, 324/76.24, 76.38, 423–424, 140 R; 702/57, 64, 67–69

(56) References Cited

U.S. PATENT DOCUMENTS

| | | | |
|---|---|---|---|
| 3,449,671 A | * | 6/1969 | Long ...................... 324/121 R |
| 3,457,505 A | * | 7/1969 | Crosby ................... 324/121 R |
| 3,725,792 A | * | 4/1973 | Kellogg ...................... 327/217 |
| 3,795,834 A | * | 3/1974 | Andrews et al. ............. 315/392 |
| 4,109,183 A | * | 8/1978 | Millard et al. ............... 315/392 |
| 4,123,705 A | * | 10/1978 | Olson ....................... 324/121 R |
| 6,263,290 B1 | * | 7/2001 | Williams et al. ........ 324/76.12 |

* cited by examiner

*Primary Examiner*—Evan Pert
*Assistant Examiner*—Jermele Hollington
(74) *Attorney, Agent, or Firm*—Edward L. Miller (57) ABSTRACT

Trigger jitter in an internally triggered real time digital oscilloscope can be reduced through correcting the horizontal position value obtained from a conventional trigger interpolation mechanism by an error or substitute amount learned from an inspection of the acquisition record that notes where in the acquisition record the signal actually crossed the trigger threshold. The display (and measurement) sub-systems that utilize the selection by panning and zooming of a portion of the acquisition record for viewing (and measurement) are supplied with the acquisition record portion of interest, and with an associated horizontal position value that originates with trigger interpolation and that may be subsequently modified by panning. After the trigger circuit detects the trigger condition for a new acquisition record, the voltage threshold for the trigger level in use by the trigger circuit can be compared to the region proximate the trigger location in the acquisition record to determine by further local interpolation the precise location in the acquisition record where the triggering event should have occurred. This allows the determination of a correct and jitter free horizontal position value. Actual display of the desired portion of each new acquisition record then proceeds by supplying to the display rendering system a corrected associated horizontal position value. This reduction in visible trigger jitter is also beneficial to measurements made on the displayed trace.

12 Claims, 3 Drawing Sheets

TRIGGER JITTER REDUCTION FOR AN INTERNALLY TRIGGERED REAL TIME DIGITAL OSCILLOSCOPE

BACKGROUND OF THE INVENTION

Real time digital oscilloscopes operate by digitizing closely spaced consecutively sampled values of an applied waveform, storing the digital values in a memory, and then re-constructing the waveform as a displayable image (the "trace") on a raster-scanned CRT by reading and processing the stored values. We shall call the stored digital values an "acquisition record" and note that its contents correspond to a definite time interval in the history of a signal's behavior. The length of that time interval is largely determined by the number of addressable memory locations devoted to a signal's acquisition (the memory's "depth") and the rate at which the samples are acquired. That sample rate will be high enough to meet Nyquist sampling and bandwidth requirements, but is in all probability not high enough to directly produce a satisfactory reproduction of the waveformn, even though it does determine what that reproduction ought to look like. Accordingly, it is conventional to "fill-in" the "missing" samples before all or some portion of the acquisition record is used, by sending the portion of interest through an interpolation filter before being used by other mechanisms.

It often happens that the acquisition record contains many times more digitized signal data than is displayed at any one time, allowing the operator to select as the displayed trace a size (degree of zoom) and location (panning) of a subset of the acquisition record. To support panning and zooming, and because the sampled values generally have an arbitrary relationship to the horizontal pixel positions in the display, the digitized data stored in the acquisition record is algorithmically processed ("rendered") to produce a graphics image in a frame buffer, from whence is created a raster-scanned display of quite modest scan line rates (as things go for CRTs). That is, the trace is not written immediately while the variations in its corresponding input signal are occurring. Only the taking of the samples is performed in real time, and once they are stored the raster-scanned display is a low speed representation of what the 'scope remembers having sampled. As mentioned, those sampled values in the acquisition record that correspond to the displayed trace are not necessarily the same in number as the number of horizontal pixel positions in the display, and digital signal processing techniques are commonly used to produce equivalent Y amplitude values that most probably would have been measured, had there been true alignment between the consecutive samples and the horizontal pixel positions. This rendering operation is essentially a process of interpolation.

Furthermore, the vast majority of oscillographic activities require that the displayed portion of the acquisition record be in some "defined relation" to a detected event originating outside the 'scope, whether that is a particular type of signal condition or transition occurring in the signal being measured, or a condition or transition in some other signal that is merely related to the signal being measured. The detection and operational response to this "defined relation" is called triggering; in the first case it is termed "internal" triggering, and "external" triggering in the second.

The term "real time" sampling is generally applied to the manner of digital oscilloscope operation described above. There is another mode of operation where a repetitive waveform cannot be densely sampled within a single instance thereof, but one (or perhaps more) samples can be obtained. For example, if the locations of those samples are allowed to "drift across" the waveform during successive instances thereof, enough samples can eventually be accumulated that a faithful reproduction of the waveform is obtained. (Provided, of course, that the waveform is repetitive, and that the trigger circuit re-triggers each time at the same relative location upon the successive instances of the waveform. The "drift" is then a precession relative to the trigger.) The old analog sampling oscilloscopes used this general technique (although they did not digitize and store values in a memory). We shall refer to the technique of digital oscilloscope operation that uses precession of samples relative to the trigger as one that practices "equivalent time" sampling. There is another equivalent time sampling technique that uses random sampling. It will be appreciated that the various manufacturers each have their own lexicography, and that there are many operational properties (and their associated descriptive terms) that arc reflections of differing internal architectures. We have chosen hereto use a particular division of the world of digital oscilloscopes into "real time" and "equivalent time" sampling, as defined above, because it is appropriate for the description that follows. It is believed that there is no significant inconsistency between our definitions and any of those promoted in the prior art. Accordingly, what follows herein should be understood according to our above definitions.

There are several useful modes of operation in connection with triggering, some of which deal with how to detect the trigger condition, and some of which deal with what to do once the trigger condition has been detected. In one (what-to-do) mode, the occurrence of the trigger indicates that thenceforth the acquisition record will be filled (or re-filled if it already has data in it) until one acquisition record's worth of subsequent data has been stored, and then the measurement ended. In another mode, some fractional portion of the acquisition is subsequently filled (the usual assumption being that the preceding portion has already got data), whereupon the measurement is ended. At the other extreme, the occurrence of the trigger can immediately end the storing of samples into the acquisition record.

The entire acquisition record can then be displayed, if desired. More typically, some selected subset of the acquisition record is displayed as the trace, beginning at some selected offset from that location in the acquisition record that corresponds to the occurrence of the trigger. That allows panning and zooming, which means that the location in the acquisition record corresponding to the trigger may or may not be a part of the displayed portion of the trace. If the trigger location is included in the visible portion of the acquisition record, then it is customary to indicate its location in the trace with some stylized indicia. (The algorithmic rendering mentioned above undertakes this annotation task, along with displaying a graticule, time per division indica and volts per division indicia, etc., by the inclusion of suitable visible pixels into the frame buffer.) The displayed and annotated trace may thus represent waveform activity that preceded the trigger, occurred after the trigger, or some combination of the two.

An aspect of real time digital 'scope operation that is of interest concerns how often a completed acquisition record is used to create a new displayed trace. In one case, a real time 'scope may capture, in just one instance of an event of interest, a complete description of that event and then display it indefinitely, regardless of what occurs next in the waveform. This is usually termed "single shot" operation. In another mode of operation, say, for a repetitive waveform such as a modulated sine wave, the acquisition record may be obtained, a portion rendered for display, and while that portion is being displayed for some brief period of time, a new acquisition record is triggered and taken, and then similarly rendered and displayed, etc. This amounts to a free-running, or "normal" mode of operation. The various manufacturers of digital 'scopes each have their own favorite terminology . . . ) This mode of operation allows the presence of variations in the waveforn to be observed.

Central to all that has been mentioned to this point is the notion of triggering. The ability to trigger on an event of interest allows the single shot mode of operation to produce a single acquisition record that contains some event of interest Likewise, when viewing a recurrent waveform in the "normal" mode, triggering is what allows the trace to "stand still" for viewing. Should the detection of the trigger condition occur at slightly varying times relative to the actual event to which it is supposed to correspond (which might be, say, an abruptly rising edge or simply a crossing of a threshold in a selected direction), then the trace will not stand still, but will appear to slide back and forth along the time axis by the amount of variation. The variation in the appearance of the trace that can be traced to such instability is called trigger jitter.

In what follows, we shall be principally interested in real time digital oscilloscopes, operated in the normal mode and with an internal trigger. As 'scopes have gotten better, and as signal speeds have gotten faster, what were previously regarded as minor variations in the performance of the trigger circuitry have become an issue in their own right. Trigger jitter can be generally be observed for any sufficiently fast repetitive signal. It arises out of the (inevitable and unavoidable) trigger delay between: (a) when the trigger condition in the signal being measured actually occurs; and, (b) when an internal trigger signal indicative of that condition becomes available and is subsequently used within the 'scope. If the delay from (a) to (b) is always the same, then there is no trigger jitter, even though the slight trigger delay manifests itself as some constant offset. Alas, there are several pernicious causes for trigger jitter that are hard to eliminate. It is essentially a problem in precision circuit behavior. The bottom line is that various circuit parameters will drift, especially as function of temperature, and circuits, especially threshold circuits, are susceptible to noise.

There is yet one more background topic of interest concerning triggering. It will be appreciated that the triggering event is under no obligation to occur in simultaneity with a taking of a sample, Note that the acquisition record amounts to a time axis along which are placed the various real time samples. What is done for each trigger event, then, is to take note of some time difference between that trigger event and some cardinal aspect of the time axis for the samples. Say, the trigger falls between sample numbers n and n+1. Then it is useful to note that the trigger occurred r-many picoseconds after sample number n, or s-many picoseconds before sample number n+1. This is an established technique that generally goes by the name "trigger interpolation" (the alternative to which is to simply assign the trigger event to one of the two samples). There may be some jitter in successive trigger interpolation values themselves during a free running display of the trace, although it is generally less than the sample-to-sample interval. Nevertheless, as a process conditioned upon the triggering process generally, jitter in the trigger interpolation values will manifest itself as an additional source of trigger jitter in the displayed trace for a sequence of consecutive acquisition sample records.

The result is that, in a conventional real time digital oscilloscope, consecutive acquisition sample records are misaligned from one another by the amount of overall trigger jitter, which is clearly visible in the normal mode trace for a sufficiently fast repetitive input signal.

Various solutions to the problems of horizontal jitter in digital oscilloscopes have been proposed: see, for example, U.S. Pat. 5,352,976 and 4,843,309. Nevertheless, there continues to be a need for a low cost and effective way of removing trigger jitter from the internally triggered trace of a real time digital oscilloscope. What to do?

SUMMARY OF THE INVENTION

Trigger jitter in an internally triggered real time digital oscilloscope can be reduced through replacing or correcting the trigger interpolation value obtained from a conventional trigger interpolation mechanism by an amount learned from an inspection of the acquisition record that notes where in the acquisition record the signal actually crossed the trigger threshold. The display(and measurement) sub-systems that utilize the selection by panning and zooming of a portion of the acquisition record for viewing (and measurement) are conventionally supplied with: (a) the acquisition record portion of interest, as well as with; (b) an associated horizontal position value that originates with the trigger interpolation value and is subsequently modified by panning. When trigger jitter occurs it begins as a different value (varying error) in that horizontal position value for each different acquisition record, and then manifests itself visually by each rendered display being shifted a different amount along the time axis. After the trigger circuit detects the trigger condition for a new acquisition record, the voltage threshold for the trigger level in use by the trigger circuit can be compared to the region proximate the trigger location in the acquisition record to "determine by inspection" (by further local interpolation) the precise location in the acquisition record where the triggering event should have occurred. This allows the determination of a correct amount for the trigger interpolation value, and that is free of jitter. Actual display of the desired portion of each new acquisition record (which may or may not include the trigger location) then proceeds by supplying to the display rendering system an associated horizontal position value that incorporates the corrected trigger interpolation value associated with that new acquisition record. The proper or corrected trigger event location can be determined by such inspection to a resolution of the nearest horizontal pixel location, or to an even greater resolution, if desired. This reduction in trigger jitter is beneficial to measurements made on the displayed trace, as well as to the simple appearance of the trace, and is also effective against drift in the trigger circuitry.

DESCRIPTION OF A PREFERRED EMBODIMENT

Figure 1:
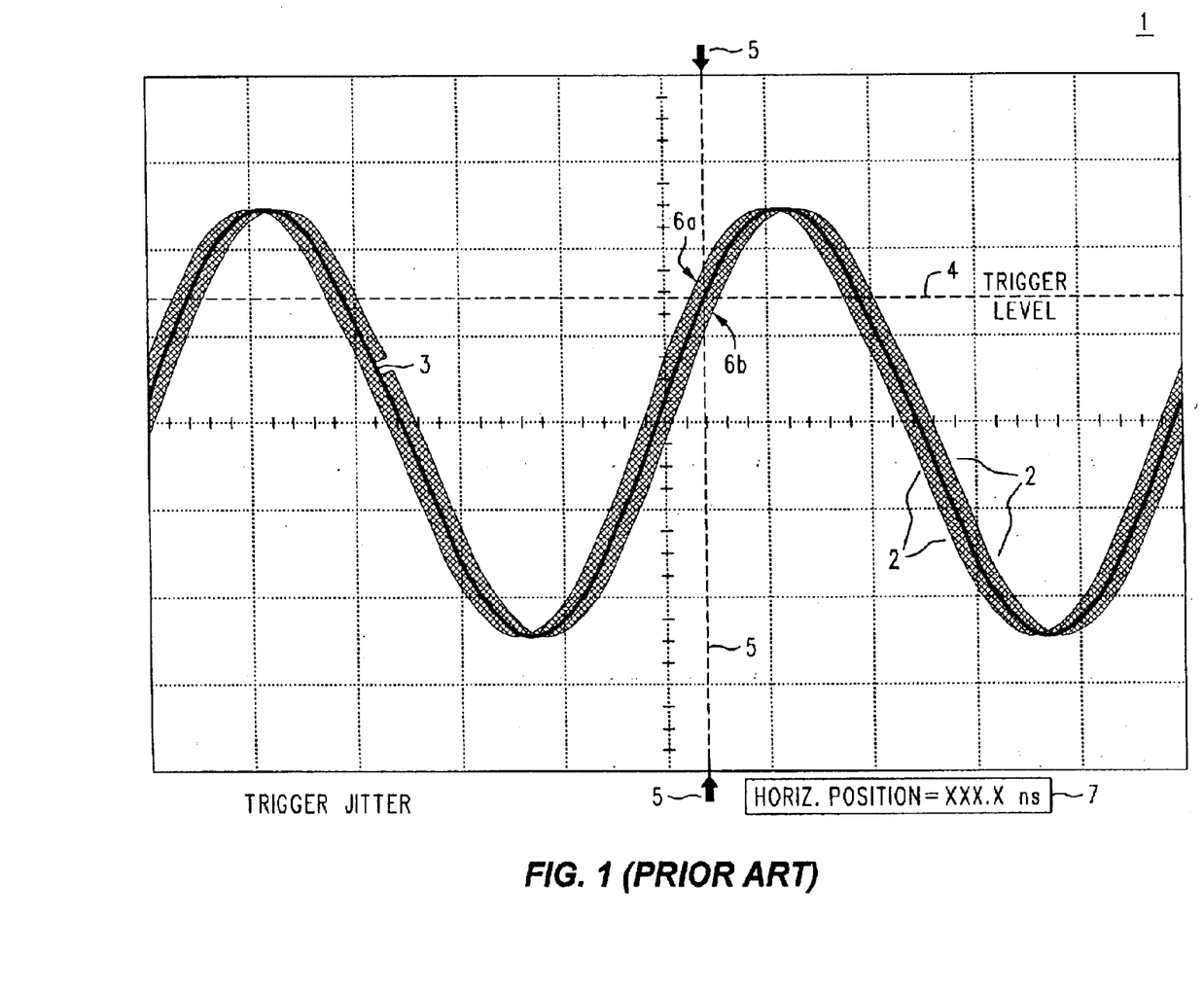
FIG. 1 is a simplified depiction of a digital oscillographic display of a trace containing trigger jitter.

Refer now to FIG. 1, wherein is shown a simplified depiction 1 of an internally triggered, free running, real time digital oscillographic display of a trace (2, 3) containing trigger jitter. The solid dark line 3 indicates what an ideal trace would look like, if there were no trigger jitter and the signal was otherwise clean and stable. The cross hatched regions on either side of the solid line 3 represent the extent of the actual trace, owing to the presence of trigger jitter. Depending on how the jitter is distributed, there may well be a central darker region of the trace corresponding to the solid line 3, indicating that the amount of jitter is more often smaller than it is larger. On the other hand, the amount of jitter might be nearly evenly distributed, resulting in little or no pronounced central trace within a suspiciously fat trace of near uniform brightness.

To continue, the work signal whose trace (2, 3) we see in FIG. 1 is a sine wave that triggers the 'scope when it crosses a threshold trigger level 4 while exhibiting a positive slope. A horizontal position icon 5 indicates the location in the displayed trace that corresponds to the currently selected horizontal position value (7), which is an offset from where the trigger event occurred. If the horizontal position value (7) were zero, then the icon 5 would also indicate the trigger. (For the sake of clarity in the figure we have arranged the display such that the location indicated by the icon 5 is the trigger but does not fall on a graticule line. FIG. 1 is perhaps somewhat contrived in this regard, but valid, nonetheless.) As can be seen from arrows 6a and 6b, the amount of apparent jitter in the trigger threshold is about 70% of one division along the Y (signal amplitude) axis. Now, if all the jitter in the trace (2,3) were indeed due to uncertainty and lack of stable repeatability in the threshold comparison mechanism proper, then we would be in the market for a seriously improved threshold comparator. However, the threshold comparator itself is nowhere near that bad, and much of the apparent amplitude variability is actually time variation in the path of the trigger signal.

Figure 2:
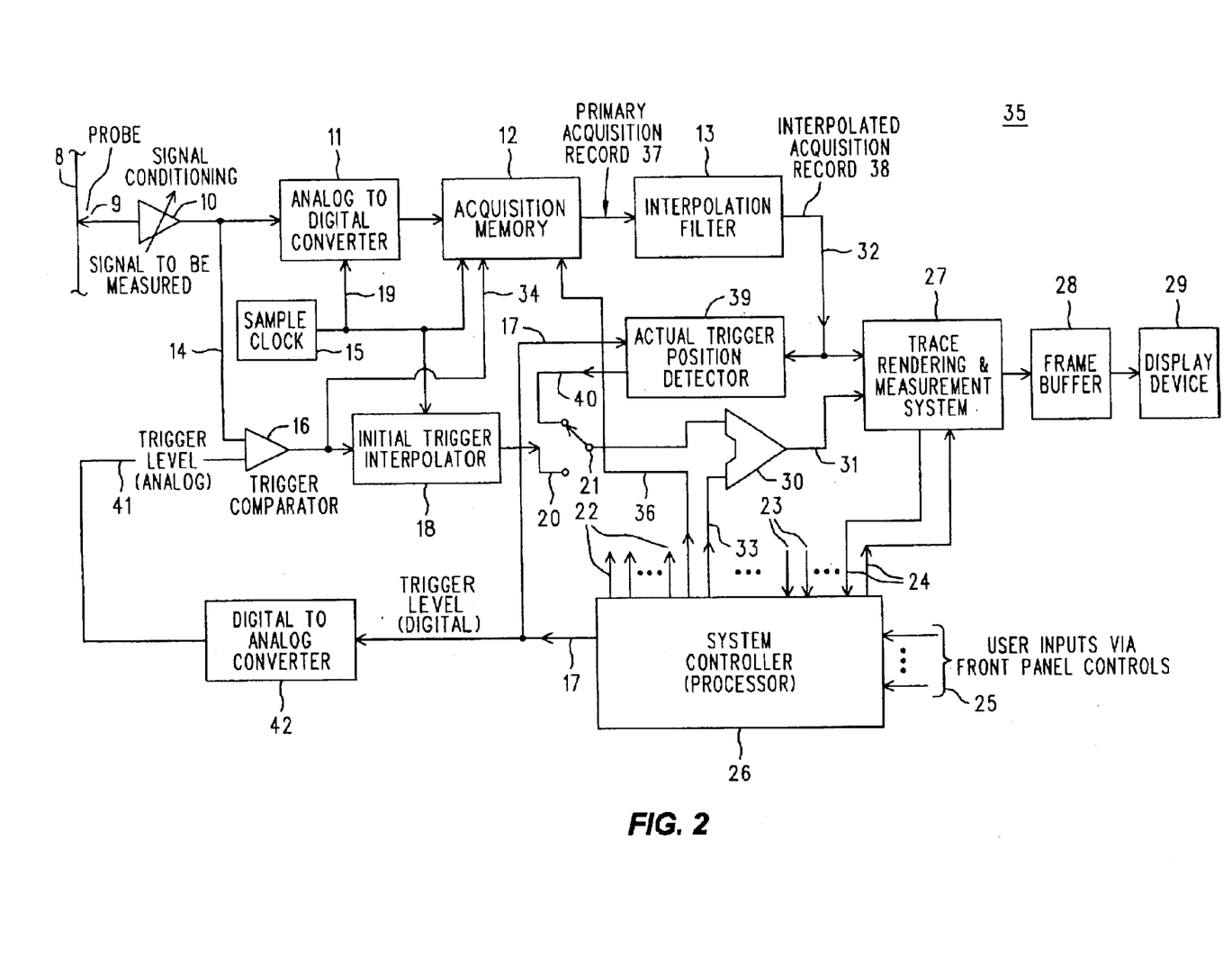
FIG. 2 is a simplified block diagram of an internally triggered real time digital oscilloscope constructed in accordance with the invention.

To begin the explanation of how a more realistic trace can be displayed, refer now to FIG. 2. It is a simplified functional block diagram 35 of a digital oscilloscope that can be operated in an internally triggered, free running, real time mode. By "functional" block diagram we mean that its primary emphasis is on the relationships between mechanisms for accomplishing certain tasks, rather than on how those mechanisms are realized and their elements collected into physical parts. Many of the boxes in our functional block diagram are algorithmic tasks performed by a processor upon data in memory. We shall describe it briefly, although much of it will be familiar to those acquainted with modern digital oscilloscopes.

An input work signal 8 to be measured is contacted 9 (most likely by a probe, but which is not explicitly shown) and coupled to a SIGNAL CONDITIONING circuit 10, where various needed operations can be performed, such as attenuation, amplification, impedance conversion and possibly bandwidth limiting. The conditioned input signal 18 is applied to an ADC 11 and to a TRIGGER COMPARATOR 16 whose output is TRIGGER SIGNAL 34. The ADC produces digitized samples at a rate determined by a SAMPLE CLOCK 15, to which it is connected. The output of the ADC is assembled into a PRIMARY ACQUISITION RECORD 37 stored in an ACQUISITION MEMORY 12, to which it is useful for us to ascribe certain exemplary properties. It is useful to think of the ACQUISITION MEMORY as a suitably large circular memory structure that allows the ADC to run continuously, and that while the 'scope is "running" simply stores the next sample in the next location in the circular structure. When the TRIGGER SIGNAL 34 occurs the storing will either stop immediately or after some selected (and definite) number of subsequent samples. To this end the TRIGGER SIGNAL 34 and another control signal 36, which may be a "further samples count" representing the desired trigger location in the acquisition record (37, 38), are supplied to the ACQUISITION MEMORY 12. As memory, the ACQUISITION MEMORY 12 is addressable, and the low level details involving actual hardware addresses are messy and will vary from one implementation to the next. As a useful simplification, let us agree to the following notational device: The TRIGGER SIGNAL 34 will occur between the storing of two consecutive samples from the ADC, the first an earlier of which we shall call "sample zero" and the second and later of which we shall call "sample one." What conventional trigger interpolation does is provide time interval values that describe how much after sample zero or before sample one the trigger event happened. Of course, the trigger event might also actually be coincident with sample zero. If it should be coincident with sample one then sample one is no longer sample one, but is treated as an instance of sample zero. In any event, with this notational device in place, we can support the idea that, once the TRIGGER SIGNAL 34 has occurred and the needed further samples are stored, there will be a PRIMARY ACQUISITION RECORD 37 stored in the ACQUISITION MEMORY 12, and that the indices zero and one describe samples that bracket the trigger location in the PRIMARY ACQUISITION RECORD 37.

The PRIMARY ACQUISITION RECORD 37 is coupled to an INTERPOLATION FILTER 13 that responds to a stream of consecutive digitized values by calculating and inserting one or more intermediate values between each pair of originally adjacent values from the ADC. The output values from the INTERPOLATION FILTER 13 comprise an INTERPOLATED ACQUISITION RECORD 38 that is made available to two mechanisms: the TRACE RENDERING & MEASUREMENT SYSTEM 27 and an ACTUAL TRIGGER POSITION DETECTOR 18. We shall return to the INTERPOLATED ACQUISITION RECORD 38 after introducing some other items.

Meanwhile, the overall operation of the 'scope is controlled by various front panel controls (not shown) that are manipulated by the operator and whose settings are understood by a SYSTEM CONTROLLER 26 that is principally a processor executing an embedded system having a complete operating system and a special purpose application program that is a digital oscilloscope control program. It will be appreciated that the SYSTEM CONTROLLER 26 has its own stash of memory, pointing device, mass storage, as well as other appurtenances appropriate to a desk-top computer. Aside from those appurtenances, there are also (output) control lines 22 that are used to exert control over various hardware mechanisms, as well as (input) control lines 23 that allow interrogation of conditions or status of such hardware mechanisms. Note in particular one such output line, 17. It is a trigger level value, which might be either the actual (analog) desired threshold voltage, or, a digital representation of that voltage. Modern digital oscilloscopes no longer supply the TRIGGER COMPARATOR with a voltage provided in a "dead reckoning style" from the wiper of a potentiometer mounted on the front panel and labeled Trigger Level. That pot might be there, but if it is, then the voltage value is digitized and used as an annunciated item in the display. More likely, the control is not a pot at all, but a rotary pulse generator with a quadrature output (as in a ball type mouse), and the software increments and decrements the trigger threshold value in response to rotation of the knob on rotary pulse generator. Then that digital value 17 is applied to a DAC 42 (Digital to Analog Converter) to produce an analog voltage 41 that is applied to the TRIGGER COMPARATOR 16. A minor variation is where the DAC is embedded in the TRIGGER COMPARATOR and the line 17 conveys the digital value to the TRIGGER COMPARATOR 16. In either case, an accurately known representation (17/41) of the threshold voltage (trigger level) is supplied to the TRIGGER COMPARATOR 16. In itself, this is conventional, but we wish to ensure that the reader appreciates that the 'scope control software executed by the SYSTEM CONTROLLER 26 knows what that threshold value is, and can supply it for use elsewhere. We shall have a use for that information in due course, The output 34 of the TRIGGER COMPARATOR 16 and the output from the SAMPLE CLOCK 15 are each applied to a TRIGGER INTERPOLATER 18. Its job is to determine when the trigger event happened relative to the sampled ADC values that we earlier termed sample zero and sample one. That is, it will produce some Δt (20) whose use we shall describe below.

Before continuing, it is appropriate that we indicate the extent of the simplifications we have indulged in, so far. While our block diagram 35, particularly as it relates to the ADC 11, ACQUISITION MEMORY 12 and INTERPOLATION FILTER 13, are good functional representations, those familiar with these applications will appreciate that many architectural tricks are employed to get 10 HP out of a 1 HP motor, so to speak. One way to get higher performance is, of course, to have very high performance parts. Even better performance can be expected by providing many sets of those parts, disposed in parallel as to function, but operated sequentially with multiplexers. The idea is to fan a high-speed data stream out into many slower data streams, and then combine the results at the end. It is an old trick that is still much used, and for the sake of brevity and simplicity, we have suppressed any such fancy techniques. Furthermore, there is usually more to triggering than a simple exceeding of a threshold. There is the direction from and rate at which it occurs, the notion of trigger hold off, and various other handy aspects of 'scope triggering that have evolved over the years. These, too, have been suppressed in favor of brevity and simplicity.

To continue, then, a portion of the PRIMARY ACQUISITION RECORD 37 is applied to the INTERPOLATION FILTER 13, and the interpolated result (32, 38) is applied, along with a corresponding value of horizontal position (31), to the TRACE RENDERING & MEASUREMENT SYSTEM 27. There are a number of things to note at this point. First, the interpolated data that is communicated over path 32 might correspond to the entire PRIMARY ACQUISITION RECORD 37 (the operator has zoomed way out) or it might correspond to just some portion of it, according to panning and zooming. To save time, only the parts of the PRIMARY ACQUISITION RECORD 37 that will end up in the display are sent through the INTERPOLATION FILTER 13. The INTERPOLATED ACQUISITION RECORD 38 is an analytic description of a waveform and has a totally arbitrary relationship to pixel locations in the eventual displayed version. The rendering mechanism in system 27 takes that analytic description, along with horizontal position value (31) and finds the appropriate pixelized representation, which is then stored in a FRAME BUFFER 28, from whence the trace (or traces) is displayed on a DISPLAY DEVICE 29.

The rendering system 27 is coupled to the SYSTEM CONTROLLER 26 by various control lines 24, and is thus able to add graticule lines and other useful indicia, such as channel identification, volts/div and time/div, triggering information, etc.

It will be appreciated that the TRACE RENDERING & MEASUREMENT SYSTEM 27 does indeed comprise tangible hardware. However, what that hardware actually can be ranges from a large ASIC (Application Specific Integrated Circuit) to simply a region in memory for data storage and another region in memory containing a suitable program (executed by the processor in SYSTEM CONTROLLER 26) to manipulate that data.

We wish to stress the point: the TRACE RENDERING & MEASUREMENT SYSTEM 27 receives two inputs: the INTERPOLATED ACQUISITION RECORD 38 and a horizontal position value 31. In a conventional 'scope the horizontal position value is the value found by the INITIAL TRIGGER INTERPOLATOR 18, as adjusted (incremented or decremented) by whatever amount the display has been panned left or right. From these two inputs are produced the pixelized version that becomes the displayed waveform trace. Trigger jitter occurs when there are spurious variations in the horizontal position value 31. The TRACE RENDERING & MEASUREMENT SYSTEM 27 uses the horizontal position value 31 to further interpolate pixel values such that the point on the trace vertically aligned with icons 5 (which are in a fixed location that is generally in the horizontal center of the display) has the stated time relationship (value 31) to the trigger. So, when value 31 varies, the trace rapidly shifts back and forth (trigger jitter) or slowly shifts (drift).

Such rapid shifting is exactly what is possible for fast signals when the 'scope is operated in a conventional manner. To resume our examination of FIG. 2, note that the output 20 of the INITIAL TRIGGER INTERPOLATOR 18 is (when the 'scope is operated in a conventional mode) coupled via a switch 20 to become one input (21) of an adder 30 whose other input (33) is the amount of time that the operator wishes to pan the trace. The output of the adder 30 (which might as well be a software function performed inside the SYSTEM CONTROLLER 26) is the horizontal position value 31 that we said above was a principal input into the TRACE RENDERING & MEASUREMENT SYSTEM 27, and whose spurious variations (occurring at 20, 33 is stable) were responsible for trigger jitter.

Here, now, is how trigger jitter or drift may be eliminated. In short, we find an alternate value for the output 20 from the INITIAL TRIGGER INTERPOLATOR 18. To do that, note that the output 32 of the INTERPOLATION FILTER 13 is additionally coupled to an ACTUAL TRIGGER POSITION DETECTOR 39, whose output 40 corresponds to output 20 (from INTERPOLATOR 18), but that is free of jitter. To operate the 'scope in the trigger jitter free mode switch 21 is thrown to couple output 40 into the adder 30, instead of output 20. All else operates as before.

To use ACTUAL TRIGGER POSITION DETECTOR 39, the portion of the PRIMARY ACQUISITION RECORD 37 that surrounds sample zero and sample one is interpolated by the INTERPOLATION FILTER 13 and the resulting INTERPOLATED ACQUISITION RECORD 38 is applied to the ACTUAL TRIGGER POSITION DETECTOR 39. The ACTUAL TRIGGER POSITION DETECTOR 39 also receives the digital value 17 that represents the trigger threshold. It is known that the trigger occurred in the vicinity of sample zero and sample one. That is, sometime in the vicinity of sample zero the real waveform being measured crossed the threshold voltage. The ACTUAL TRIGGER POSITION DETECTOR 39 is an interpolation mechanism that finds the amount of time (40) after zero that the analytic description (in the form of the instance of INTERPOLATED ACQUISITION RECORD 38 just mentioned, and that contains sample zero and sample one) has a voltage value equal to the threshold voltage 17. It is clear that value 40 is what value 20 should have been. Accordingly, we use value 40 in place of value 20. We proceed further by now forming the particular (and probably different) INTERPOLATED ACQUISITION RECORD 38 of interest according to the currently specified pan and zoom settings, and then send that (and its horizontal position value, based on value 40) to the TRACE RENDERING & MEASUREMENT SYSTEM 27 for processing.

Figure 3:
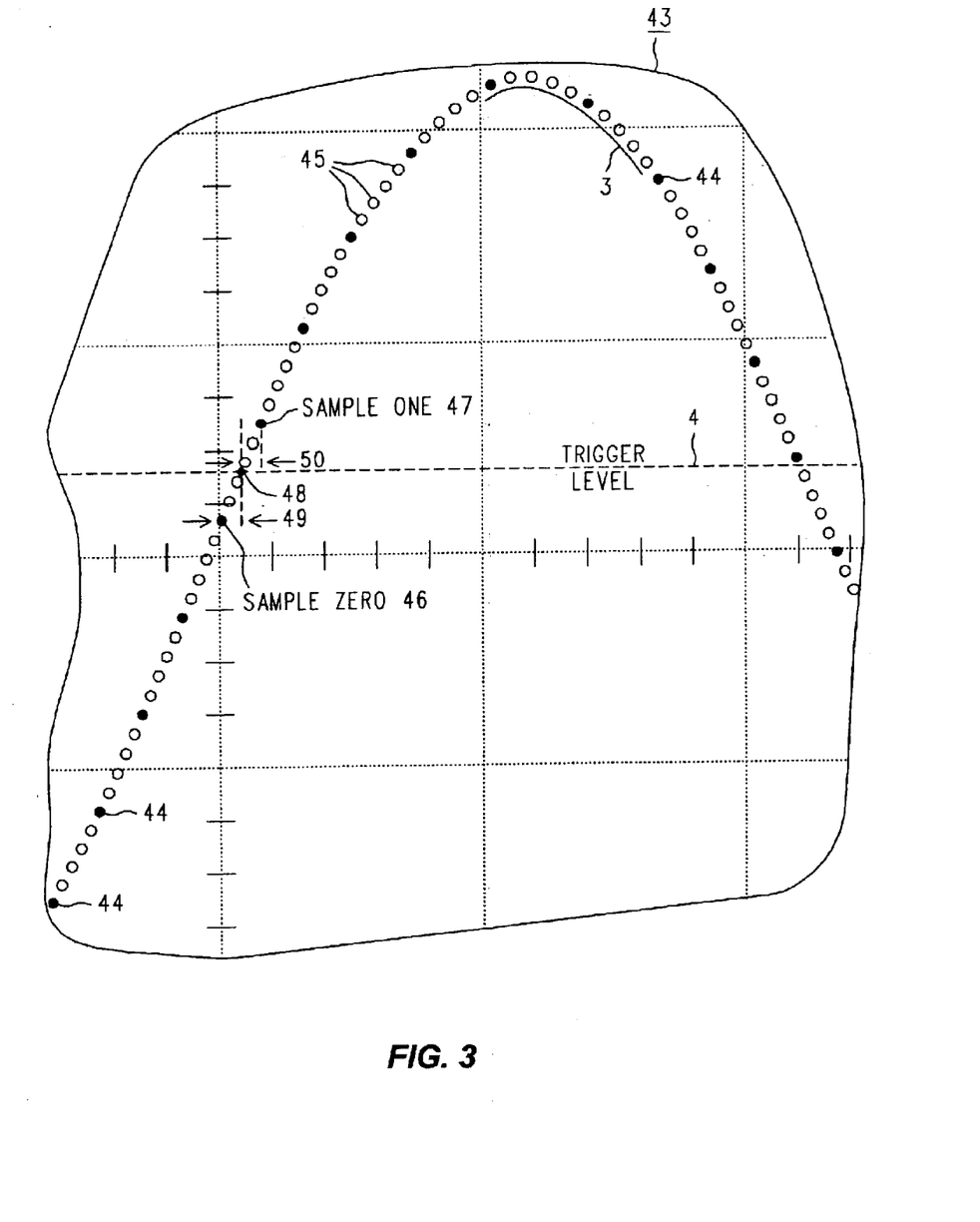
FIG. 3 is a simplified depiction of a trace, such as that of FIG. 1, from which trigger jitter has been removed in accordance with the invention.

Refer now to FIG. 3, wherein is depicted a portion 43 of the trace 3 of FIG. 1 that has been rendered and displayed according to the invention. In the trace the solid dots 44 represent actual samples taken by the ADC 11 and that are part of the PRIMARY ACQUISITION RECORD 37. Interspersed between the solid dots 44 are hollow dots 45 that represent the additional points produced by the INTERPOLATION FILTER 13. The combined collection of dots 44 and 45 are the INTERPOLATED ACQUISITION RECORD 38. For clarity they are shown further apart than they would ordinarily be in an actual displayed trace. Note also the trigger level 4, which typically intersects the trace 3 at a location that is not represented by an actual sample 44, and that very probably does not fall on an interspersed location 45, either. Further, note sample zero (46) and sample one (47). These are the actual samples defining a region in time in the vicinity of which the trigger event occurred. In the example of FIG. 3 the location (48) where the trace crosses the threshold 4 is clearly an interior point of that region of time. In the general case it could be at least as early as sample zero, and at least as late as just before sample one.

Ordinarily, we would expect that the value (20) produced by the INITIAL TRIGGER INTERPOLATOR 18 would be the time interval marked 49 in FIG. 3. If there were no trigger jitter, then that would indeed be the case. However, as we have already said, that is typically not the case, and the actual value (20) from the INTERPOLATOR 18 is generally in error by the amount we call trigger jitter. So, what we want to do is find the time interval 49 and use it in place of value 20. This activity is performed by the element identified as the ACTUAL TRIGGER POSITION DETECTOR 39, whose output is a value 40. Value 40 and time interval 49 are the same thing, and the ACTUAL TRIGGER POSITION DETECTOR 39 is an act of interpolation, either by a separate arithmetic mechanism dedicated to that task or by a segment of programming executed by the processor in the SYSTEM CONTROLLER 26.

Before proceeding, we should acknowledge an alternative. To obtain time interval 49/20 directly as a count in a counter inside INTERPOLATOR 18 suggests that we would start (and re-start) that counter on each sample taken by the ADC, and stop the count and capture its value upon the TRIGGER SIGNAL 34. It is not that such a thing does not work, but might be easier to start the counter with the TRIGGER SIGNAL 34 and stop it (and capture the value) upon the next instance of the SAMPLE CLOCK. In fact, we prefer to practice this latter method. However, it is clear that it produces the time interval 50 (from point 48 to point 47, but on the real conditioned input waveform 14!). To get interval 49/20 we subtract time interval 50 from the period of the SAMPLE CLOCK.

There are various possibilities about how to proceed, depending upon implementation preferences. The information needed to proceed is all contained in one form or another in the PRIMARY ACQUISITION RECORD 37, the INTERPOLATED ACQUISITION RECORD 38, and the value 20 produced by the INITIAL TRIGGER INTERPOLATOR 18. To start, recall that we adopted the notation "sample zero" and "sample one" as a device to represent the ability to identify which of actual samples 44 bracket the trigger event produced by the TRIGGER COMPARATOR 16. This was a welcome simplification, since the ACQUISITION MEMORY 12 is an addressable circular structure, and there are many ways that the corresponding addresses could be trapped and made available. These range all the way from having dedicated registers that receive those addresses, to a technique for adding a bit or two to the content of the addressable locations in the ACQUISITION MEMORY 12 to flag those, locations so that they can be discovered by traversing the PRIMARY ACQUISITION RECORD.

A simple way to proceed would be to interpolate between sample zero and sample one to find the size of time interval 49. (Recall that the interpolation mechanism (39) is supplied with a digital value (17) for the trigger level.) Straight line interpolation is fast and effective, although in places where there is significant curvature in the original waveform it may be error prone. This difficulty may be mitigated by interpolating between the interspersed points 45 that were inserted by the INTERPOLATION FILTER 13. (Their production can be more sophisticated, and they preferably do describe curves were appropriate. Subsequent straight line interpolation between those points is thus not as error prone.) This plan calls for traversing a portion of the INTERPOLATED ACQUISITION RECORD 38 between sample zero 46 and sample one 47. Within that portion there will be two adjacent points that have amplitude values that either bracket the trigger level 4 or that one of which falls upon it. We can then discover the time and amplitude coordinated for point 48, and, since we know the time intervals between all supplied points in the interval (44-style points are a period of the SAMPLE CLOCK apart, while 45-style points divide that period by a known integer amount), we can arrive at a value for time interval 49.

There is yet another way to proceed. That is to use the value 20 as an index into the portion of the INTERPOLATED ACQUISITION RECORD about sample zero 46. Then, beginning at that location begin looking for values that fall on or that bracket the trigger level 4, and then interpolate.

And now to admit a complication which we have ignored to this point. Upon reflection, it will be appreciated that the mechanism that produces trigger jitter in the first place may also introduce uncertainty about whether sample zero and sample one actually bracket the location 48. An easy way to see this is to suppose that the correct size for interval 49 is very close to zero (close to sample zero) or very large (close to sample one). Then slight variations in the operation of the system could cause the true location of point 48 to fall outside the interval of sample zero to sample one. This is not fatal; it just means that we have to be prepared to, as we phrased it earlier, look in the vicinity of sample zero (and sample one) to locate point 48.

Trigger slope is a topic of interest. It is certainly the case that the actual hardware trigger circuit has to know about that, and it is desirable that our traverse of the ACQUISITION RECORD that we are concerned about mimics, insofar as is possible, the behavior of the actual hardware trigger circuit. So, for example, it is not safe to rely on bandwidth limiting to prevent more than one crossing of the trigger threshold "in the vicinity" that is known to be of interest. Thus, we should take the expected sign of dv/dt and other possibilities into account as we traverse along the reconstructed waveform in search of a threshold crossing. Thus, although FIG. 2 does not explicitly show that the ACTUAL TRIGGER POSITION DETECTOR 39 receives trigger slope information, it will be understood and appreciated that it does. These topics will be described in more detail, below.

It is also possible, depending upon the details of a specific implementation, that the discovery of interval 49 arises as a correction made to value 20, rather that as a substitute for it.

So, in summary, when trigger jitter reduction according to the invention is desired, we first find the time interval 49, in the manner described above, by an inspection of a suitable portion of the ACQUISITION RECORD (37 or 38), and then proceed to supply a stabilized horizontal position value 31 (based on 40/49) to the TRACE RENDERING & MEASUREMENT SYSTEM 27, along with the appropriate INTERPOLATED ACQUISITION RECORD 38. Note that this technique works regardless of where the trigger is located in the ACQUISITION RECORD, which means that the trigger location may or may not be visible in the final trace.

There is, however, and additional case that we have not touched on, but that is easy to understand in light of what we have set out above. It is a type of operation that in the days of analog 'scopes was called "delayed sweep" and that may be described as follows. The trigger occurs, and then there is a selected period of delay, say, one millisecond. After the delay the 'scope retains, say, one microsecond of data sampled at full speed. There is no where near enough memory in the 'scope to store one thousand and one microseconds of data taken at full speed! Instead, the technique is to segment the use of the ACQUISITION MEMORY 12 (a conventional technique), store the captured waveform in the vicinity of the trigger in the first part, then discard the next thousand microseconds of samples by not storing them, followed by storing the next one microsecond of data. The problem of trigger jitter still applies, and our solution still works. We simply add the one thousand microseconds to the value of the horizontal position value 31, and render the display as ususal.

Here now follow some specifics for one particular implementation that is used in the Agilent 54855A Digital Oscilloscope. If the sample rate is reduced to below a certain level the ACQUISITION RECORD will not contain sufficient information to all accurate actual trigger placement in the reconstructed waveform. In such a case we then just use value 20 in a conventional manner. Likewise, if the 'scope is operated in other than a real time mode (not all samples for a given rendering of a trace are placed onto a single time axis having a common instance of jitter), or if the trigger is not taken internally from a waveform we measured by sampling (e.g., it is obtained from an external trigger input that does not produce a trace), we do not use this technique for trigger jitter reduction.

If the operator of the 'scope sets the hardware trigger level to a value that is beyond the range of the ADC, then the trigger level voltage supplied to the trigger jitter reduction mechanism is a trigger level voltage equal to that maximum ADC value.

Furthermore, it has been found satisfactory to:

(A) Limit the search in the ACQUISITION RECORD (37/38) to a selected vicinity about the expected location of the trigger event. In the Agilent 54855A that selected vicinity is a plus or minus two nanosecond range.

(B) Using the value 20 as the expected location, we begin searching the ACQUISITION RECORD (37/38) at a selected location ahead of that (say, 800 picoseconds for the Agilent 54855A), proceeding in the direction of increasing time along the time axis, investigating pairs of adjacent entries in the record, until the (two nanosecond) limit is reached. If the trigger event is not found, then we return to the starting point (−800 ps) and search in the other direction until that limit is reached. Investigation means checking to see if the trigger level (17) falls on or between the entries in the pair. If it falls between, then interpolate. See below.

(C) In looking for a positive slope (rising edge) crossing of a threshold, we consider four outcomes.
  (1) If there are samples above the threshold and then samples below it, we have found a falling edge, which is ignored. If there are samples below the threshold and then samples above it, we have found a rising edge, and interpolate to find a replacement value 40.
  (2) If all the samples in the vicinity are below the threshold, we assume the trigger must be far to the right and supply the maximal positive corrected value, as described above.
  (3) If all the samples in the vicinity are above the threshold, we assume the trigger must be far to the left, and supply the maximal negative corrected value, as described above.
  (4) If there are only samples above the threshold and then samples below it, and we never find a rising edge, then we have no value 40 and continue to use value 20.

(D) In looking for a negative slope (falling edge) crossing of a threshold, we also consider four outcomes.
  (1) If there are samples below the threshold and then samples above it, we have found a rising edge, which is ignored. If there are samples above the threshold and then samples below it, we have found a falling edge, and interpolate to find a replacement value 40.
  (2) If all the samples in the vicinity are above the threshold, we assume the trigger must be far to the right and supply the maximal positive corrected value, as described above.
  (3) If all the samples in the vicinity are below the threshold, we assume the trigger must be far to the left, and supply the maximal negative corrected value, as described above.
  (4) If there are only samples below the threshold and then samples above it, and we never find a falling edge, then we have no value 40 and continue to use value 20.

We claim:

1. A method of trigger stabilization in a digital oscillographic instrument, the method comprising the steps of:
  (a) digitizing consecutively sampled locations along an input signal whose waveform is to be reproduced by the oscillographic instrument;
  (b) storing digital values for the consecutively sampled locations of step (a) in an acquisition memory;
  (c) during steps (a) and (b), comparing the input signal against a trigger threshold to produce a trigger signal having an onset when the input signal crosses the trigger threshold;
  (d) measuring a trigger interpolation time interval between the onset of the trigger signal and one of the pair of consecutively sampled locations spanning the interval of time that includes when the onset of the trigger signal occurs;

(e) subsequent to the onset of the trigger signal produced in step (c), storing a selected number of zero or more additional digital values in the acquisition memory; and then (f) interpolating, within a selected region of the digital values stored in the acquisition memory and that are in a vicinity thereof indicated by the trigger interpolation time interval, to find a time axis value that corresponds to a reconstructed waveform having an amplitude equal to the trigger threshold; and (g) displaying a reconstruction of the input signal having a time axis based on the value found by the interpolation in step (f).

2. A method as in claim 1 further comprises the step of inserting, prior to step (f), intervening interpolated values between the consecutively sampled locations stored in the acquisition memory.

3. A method as in claim 1 further comprising the step of segmenting the acquisition memory into a first segment used to store digital values describing a trigger event, and a second segment used to store digital values occurring subsequent to a selected delay, and wherein step (g) adds the selected delay to the value found by interpolation in step (f) is from the first segment and the displayed reconstruction of the input signal is of the digital data in the second segment.

4. A method of producing a trigger interpolation value for a digital oscillographic instrument, the method comprising the steps of:

(a) digitizing consecutively sampled locations along an input signal whose waveform is to be reproduced by the oscillographic instrument;

(b) storing digital values for the consecutively sampled locations of step (a) in an acquisition memory;

(c) during steps (a) and (b), comparing the input signal against a trigger threshold voltage to produce a trigger signal having an onset when the input signal crosses the trigger threshold voltage;

(d) finding with trigger circuit hardware coupled to the input signal a measured trigger interpolation value approximating the location of a trigger signal onset along a time axis bounded by two consecutively sampled locations;

(e) traversing a region of the acquisition memory indexed by the measured trigger interpolation value of step (d) and its bounding consecutively sampled locations;

(f) interpolating within the region traversed in step (e) to find a time axis value that corresponds to a reconstructed waveform having an amplitude corresponding to the trigger threshold voltage;

(g) determining the length of the time interval from one of the bounding consecutively sampled locations and the time axis value interpolated in step (f); and (h) replacing, for subsequent use in the digital oscillographic instrument, the measured trigger interpolation value of step (d) with the time interval length determined in step (g).

5. A method as in claim 4 wherein the replacing performed in step (h) is contingent upon the absolute value of the value determined in step (g) being less than a selected amount.

6. A method as in claim 4 wherein the time interval length determined in step (g) is limited to not exceed a selected magnitude.

7. A method as in claim 4 wherein the magnitude of the trigger level threshold voltage exceeds that of the voltage that can be digitized in step (a), and the amplitude corresponding to the trigger threshold voltage used in step (f) is limited to that of the voltage that can be digitized in step (a).

8. A method as in claim 4 further comprises the step of inserting, prior to step (e), intervening interpolated values between the consecutively sampled locations stored in the acquisition memory.

9. A method as in claim 8 wherein the traversing of step (e) further comprises visiting consecutively stored values in the acquisition memory to locate a bracketing pair thereof whose values form an interval that includes a value corresponding to the trigger threshold voltage.

10. A method as in claim 9 wherein the replacing performed in step (h) is contingent upon locating a bracketing pair.

11. A method as in claim 9 wherein the replacing performed in step (h) is contingent upon locating a bracketing pair whose connecting line segment crosses the value corresponding to the trigger threshold voltage in a selected direction.

12. A method of trigger stabilization in a digital oscillographic instrument, the method comprising the steps of:

(a) digitizing consecutively sampled locations along an input signal whose waveform is to be reproduced by the oscillographic instrument;

(b) storing digital values for the consecutively sampled locations of step (a) in an acquisition memory;

(c) during steps (a) and (b), comparing the input signal against a trigger threshold to produce a trigger signal having an onset when the input signal crosses the trigger threshold;

(d) measuring a trigger interpolation lime interval between the onset of the trigger signal and one of the pair of consecutively sampled locations spanning the interval of time that includes when the onset of the trigger signal occurs;

(e) subsequent to the onset of the trigger signal produced in step (c), storing a selected number of zero or more additional digital values in the acquisition memory; and then (f) interpolating, within a selected region of the digital values stored in the acquisition memory and that are in a vicinity thereof indicated by the trigger interpolation time interval, to find a time axis value that corresponds to a reconstructed waveform having an amplitude equal to the trigger threshold; and (g) performing a selected measurement upon a reconstruction of the input signal having a time axis based on the value found by the interpolation in step (f).

\* \* \* \* \*